(12) United States Patent
Hamada et al.

(10) Patent No.: US 7,106,133 B2
(45) Date of Patent: Sep. 12, 2006

(54) DISTORTION COMPENSATOR

(75) Inventors: Hajime Hamada, Kawasaki (JP);
Hiroyoshi Ishikawa, Kawasaki (JP);
Kazuo Nagatani, Kawasaki (JP);
Tokuro Kubo, Kawasaki (JP);
Nobukazu Fudaba, Kawasaki (JP);
Yasuyuki Oishi, Kawasaki (JP); Toru Maniwa, Kawasaki (JP); Hiroyuki Hayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/999,747

(22) Filed: Nov. 30, 2004

(65) Prior Publication Data

US 2005/0073361 A1   Apr. 7, 2005

Related U.S. Application Data

(63) Continuation of application No. PCT/JP02/05372, filed on May 31, 2002.

(51) Int. Cl.
*H03F 1/26* (2006.01)

(52) U.S. Cl. ............... 330/149; 330/136; 330/296
(58) Field of Classification Search ............ 330/149, 330/136, 2, 107, 296
See application file for complete search history.

(56) References Cited

U.S. PATENT DOCUMENTS 5,892,397 A * 4/1999 Belcher et al. ............. 330/149
5,903,611 A * 5/1999 Schnabl et al. ............. 375/297
6,091,941 A * 7/2000 Moriyama et al. .......... 455/126
6,272,326 B1   8/2001 Shinde
6,552,609 B1 * 4/2003 Hamada et al. ............. 330/149
6,836,517 B1 * 12/2004 Nagatani et al. ............ 375/296
2001/0005402 A1   6/2001 Nagatani et al.
2001/0007435 A1   7/2001 Ode et al.

FOREIGN PATENT DOCUMENTS

| EP | 1 011 192 | 6/2000 |
| JP | 2000-31840 | 1/2000 |
| JP | 2000-036767 | 2/2000 |
| JP | 2000-228643 | 8/2000 |
| JP | 2001-189685 | 7/2001 |
| JP | 2001-251148 | 9/2001 |
| JP | 2001-284976 | 10/2001 |
| JP | 2002-016507 | 1/2002 |
| JP | 2003-298362 | 10/2003 |
| JP | 2003-298666 | 10/2003 |
| WO | WO 02/101919 | 12/2002 |

* cited by examiner

*Primary Examiner*—Patricia Nguyen
(74) *Attorney, Agent, or Firm*—Katten Muchin Rosenman LLP

(57) ABSTRACT

The distortion compensator which compensates the nonlinearity of a power amplifier in a radio communication device stops the operation of updating the automatic phase adjustment, automatic delay adjustment, equalizer adjustment, and distortion compensation table when something wrong is detected in the input to a distortion compensation unit such as a reference signal, feedback signal, address of the distortion compensation table, and phase value so that the distortion compensation coefficients may not be improperly updated.

16 Claims, 11 Drawing Sheets

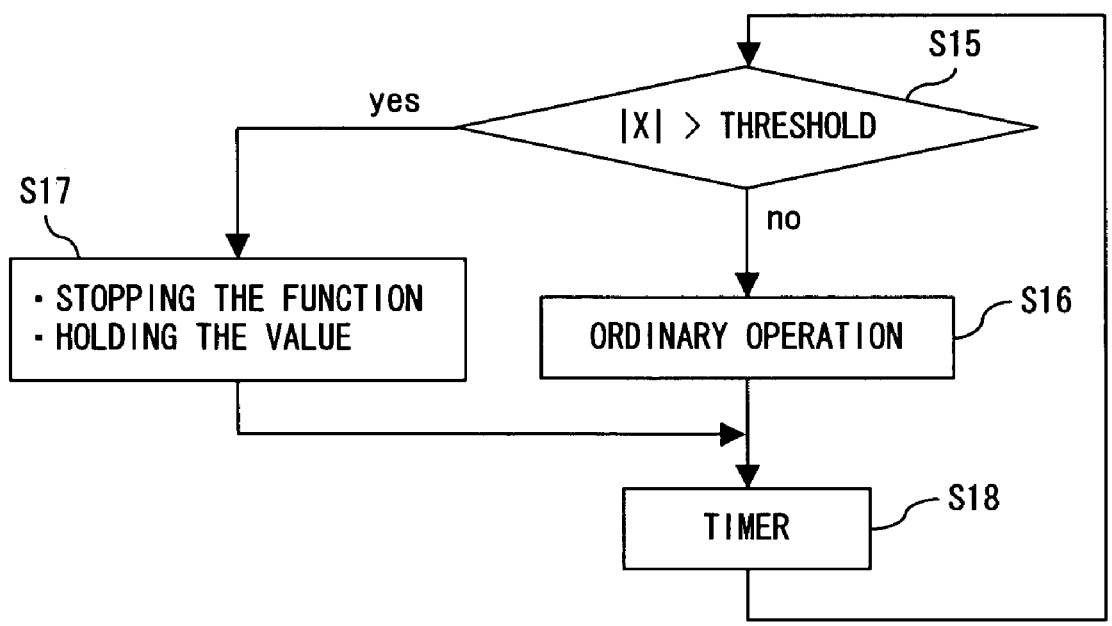
F I G. 6

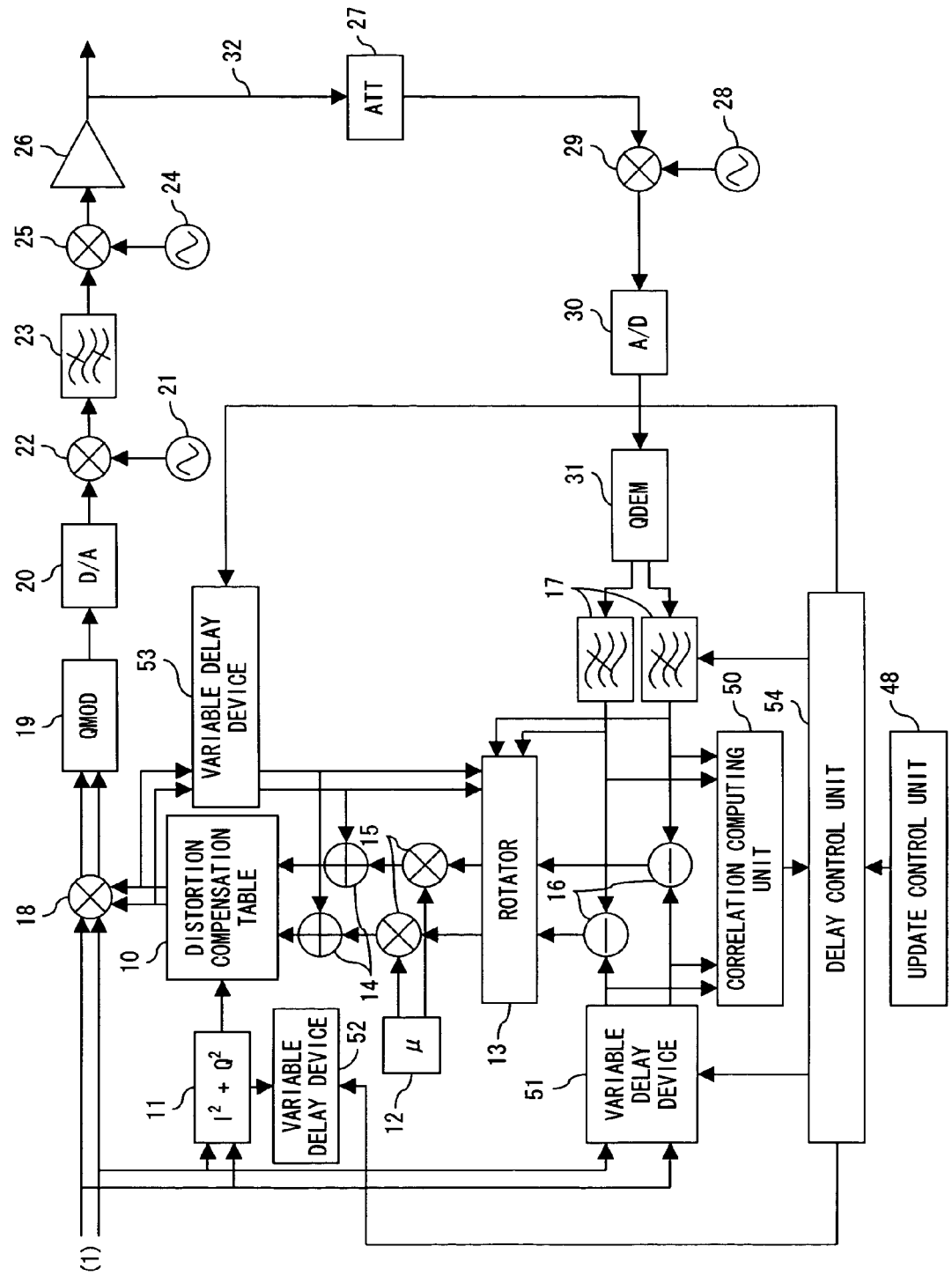
F I G. 7

DISTORTION COMPENSATOR

CROSS REFERENCE TO RELATED APPLICATION

This application is a continuation of an International Application No. PCT/JP02/05372, which was filed on May 31, 2002.

BACKGROUND OF THE INVENTION

1. Field of the Invention

The present invention relates to an adaptive predistortor type distortion compensator which operates an adaptive algorithm so that errors of a reference signal and a feedback signal outputted from an amplifier may be minimized in order to calculate a distortion compensation coefficient and increase the efficiency of the amplifier by compensating the nonlinear distortion of the amplifier using this distortion compensation coefficient.

2. Description of the Related Art

FIG. 1 shows an example of the basic configuration of a conventional adaptive predistortor type distortion compensator. An input baseband signal (1) is a complex baseband signal comprising I signal and Q signal.

The input baseband signal (1) is multiplied by a distortion compensation coefficient in the multiplier 18 and is inputted to the quadrature modulator 19. A signal modulated by the quadrature modulator 19 is converted into an analog signal by the digital-to-analog converter 20. This analog signal is multiplied by a periodic wave of the local oscillator 21 in the multiplier 22, and is converted into a signal of an intermediate frequency (IF). The signal of the intermediate frequency generated in this way passes through the band-pass filter 23; is multiplied by the periodic wave of the local oscillator 24 in the multiplier 25; is converted into a radio frequency (RF); is amplified and transmitted by the (power) amplifier 26.

The input baseband signal (1) is converted into a power value by the power computing unit 11, and is used to index a distortion compensation coefficient from the distortion compensation table 10 which stores the distortion compensation coefficient in a memory using the power value of the input baseband signal (1) as an address.

The input baseband signal (1) is also inputted as a reference signal (3) to the subtractor 16 which obtains an error signal e (t) from a feedback signal (2) and the input baseband signal.

The output from the amplifier 26 is separated by the feedback path 32 and is attenuated by the attenuator 27. The output is multiplied by the periodic wave of the local oscillator 28 in the multiplier 29 and is returned to the intermediate frequency. Also, the output is converted into a digital signal in the analog-to-digital converter 30; is demodulated in the quadrature demodulator 31; and I signal and Q signal are generated. I signal and Q signal pass through the low-pass filter 17, and are inputted to the rotator 13, and at the same time are also inputted to the subtractor 16 as a feedback signal (2).

An error signal e(t) which is a difference between a reference signal (3) and a signal in which a feedback signal (2) from the amplifier 26 is attenuated to a reasonable amplitude by the attenuator 27 (which is shown by ATT in FIG. 1) is computed as a digital signal. In the example shown in FIG. 1, a clipped LMS algorithm is used as an adaptive algorithm, and the distortion compensation coefficient $h_n(p)$ (p is the power of the reference signal) is updated for the quantitized amplitudes of the signals using e(t) by the following expression.

$h_n(p) = h_{n-1}(p) + \mu e(t) det[h_{n-1}(p)] det[y(t)^*]$, wherein $$det[R + jI] = \frac{1}{\sqrt{2}}[sgn(R) + j sgn(I)]$$

$$sgn(x) = \begin{cases} 1 & (x \geq 0) \\ -1 & (x < 0) \end{cases}$$

Note, however, that y(t) indicates a feedback signal; * indicates a complex conjugate; j indicates an imaginary unit; and p indicates an update step of a distortion compensation coefficient. This computing is conducted by the rotator 13, update storage unit 12, multiplier 15, adder 14 and distortion compensation table 10 shown in FIG. 1. This algorithm is the one in which a circuit configuration is simplified by multiplying the part to be multiplied by an error signal in which complex multiplication is required in an ordinary LMS algorithm by det $[h_{n-1}(p)]$ det $[y(t)^*]$ i.e. by conducting only the phase rotation of 0, π/2, π and 3π/2.

Refer to Kokai (Jpn. unexamined patent publication) No. 9-68733 for the details of an adaptive predistortor type distortion compensator.

If the signal level of the reference signal (3) or the feedback signal (2) becomes 0 (zero) or only a noise component, various functions of the distortion compensator do not properly operate.

SUMMARY OF THE INVENTION

The purpose of the present invention is to provide a distortion compensator which can secure a proper operation of a distortion compensator even when the signal level of a reference signal or a feedback signal becomes 0 (zero) or only a noise component due to a fault, etc. of the distortion compensator.

The distortion compensator embodying the present invention comprises a distortion compensation coefficient storage unit for storing a distortion compensation coefficient which compensates distortion by multiplying an input baseband signal, a distortion compensation coefficient update unit for updating the distortion compensation coefficient, and a distortion compensation stop unit for stopping a distortion compensation operation when something wrong occurs to the input of a distortion compensation unit comprising at least the distortion compensation coefficient storage unit and the distortion compensation coefficient update unit, in a distortion compensator which compensates the nonlinearity of an amplifier included in a communication device.

The distortion compensation method embodying the present invention comprises a distortion compensation coefficient storage step for storing a distortion compensation coefficient which compensates distortion by multiplying an input baseband signal, a distortion compensation coefficient update step for updating the distortion compensation coefficient, and a distortion compensation stop step for stopping a distortion compensation operation when something wrong occurs to the input of a distortion compensation step comprising at least the distortion compensation coefficient storage step and the distortion compensation coefficient update step, in a distortion compensation method which compensates the nonlinearity of an amplifier included in a communication device.

According to the present invention, even if information necessary for distortion compensation is not correctly obtained due to a fault, etc. of the distortion compensator, any improper distortion compensation operation can be prevented. Therefore, the operation of the distortion compensator is stable, and the distortion compensator can perform distortion compensation with higher accuracy and perform better-quality communications.

BRIEF DESCRIPTION OF THE DRAWINGS

FIG. 6 is a flowchart (3) of the processing that the updating control unit 48 performs.

FIG. 7 shows the block diagram of an adaptive predistortor type distortion compensator in which delay control is considered.

DETAILED DESCRIPTION OF THE PREFERRED EMBODIMENTS

In the embodiment of the present invention, in order to prevent the malfunction of the distortion compensation function due to a fault, etc. of the distortion compensator, the deterioration of distortion compensation characteristics is prevented by detecting the abnormality and stopping each function. Described below is the embodiment according to each function.

1. Automatic Phase Adjustment

Figure 1:
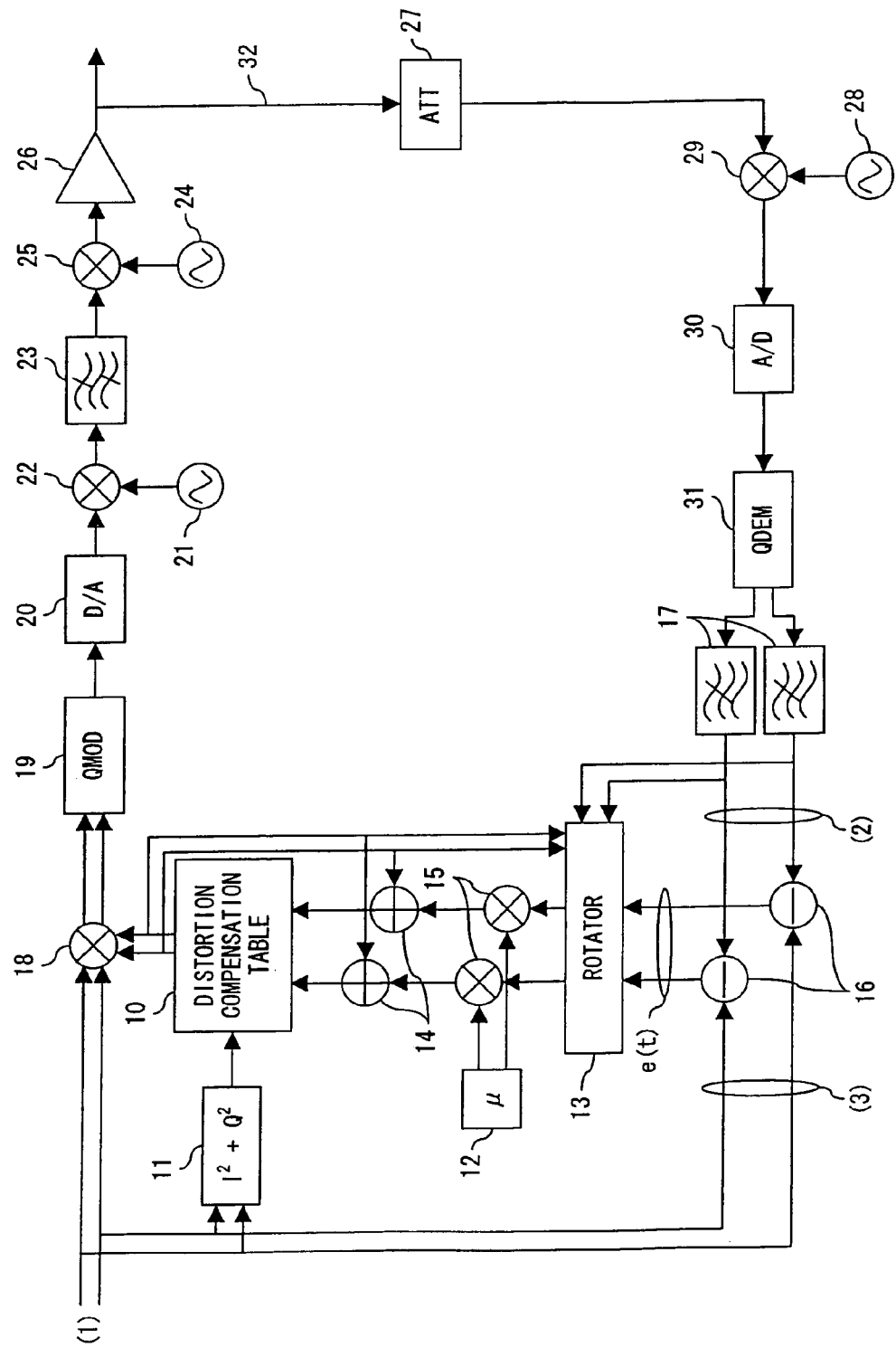
FIG. 1 shows the basic configuration of a conventional adaptive predistortor type distortion compensator.
Figure 2:
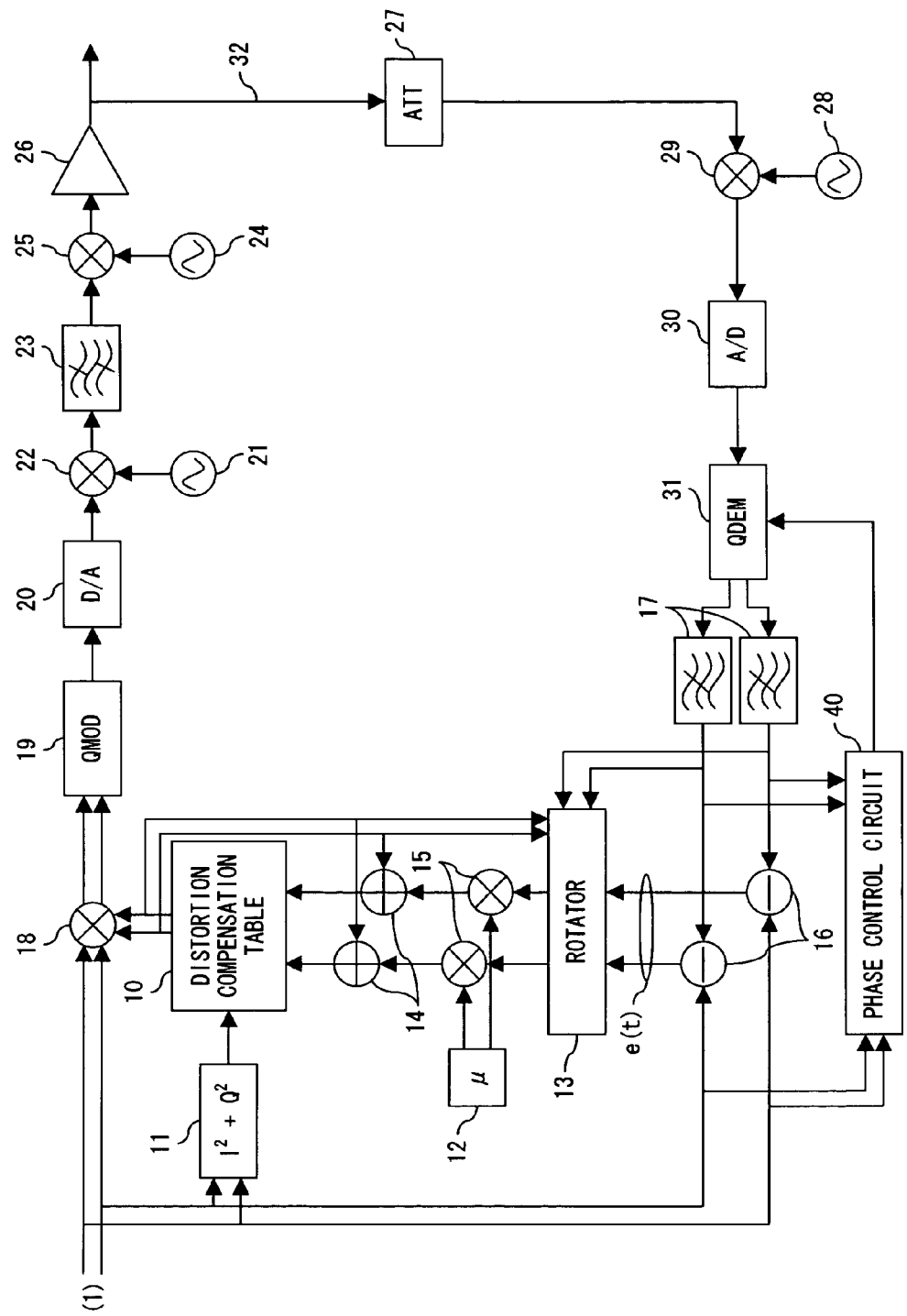
FIG. 2 shows the embodiment of the present invention in a distortion compensator including a phase adjustment circuit.

FIG. 2 shows the embodiment of the present invention in a distortion compensator including a phase adjustment circuit. For convenience' sake, the same reference number or mark is given to the same constituent shown in FIG. 1 to omit a detailed description of the constituent.

If the updating of a distortion compensation table is started when the phase of a reference signal and that of a feedback signal (phase of I-Q plane) do not conform to each other, it takes a long time until a distortion compensation coefficient becomes a true value. Then, an adjustment to make both the phases conform to each other is made. This is called an automatic phase adjustment. The automatic phase adjustment is carried out by detecting the phase difference between a reference signal and a feedback signal in the phase control circuit 40 and adjusting, in the quadrature demodulator 31, the phase of a periodic wave multiplied for demodulation by a signal transmitted through the feedback path 32.

There are various kinds of algorithms for phase adjustment, but described below is the method which uses the correlation value of a reference signal s (t) and a feedback signal y (t). Correlation computation can be indicated by the following expression.

$$S(t)y(t)^* = [s_i(t) + js_q(t)][y_i(t) + jy_q(t)]^*$$
$$= [s_i(t) + js_q(t)]\{[s_i(t) + js_q(t)]\exp(j\theta)\}^*$$
$$= [s_i(t) + js_q(t)][s_i(t) - js_q(t)]\exp(-j\theta)$$
$$= [s_i^2(t) + s_q^2(t)]\exp(-j\theta)$$

If the phases of both signals conform to each other based on this expression (namely, θ=0), the real part of the correlative value becomes maximum, and the imaginary part becomes 0. The sign bit of the result of this imaginary part is used as phase update information.

Figure 3:
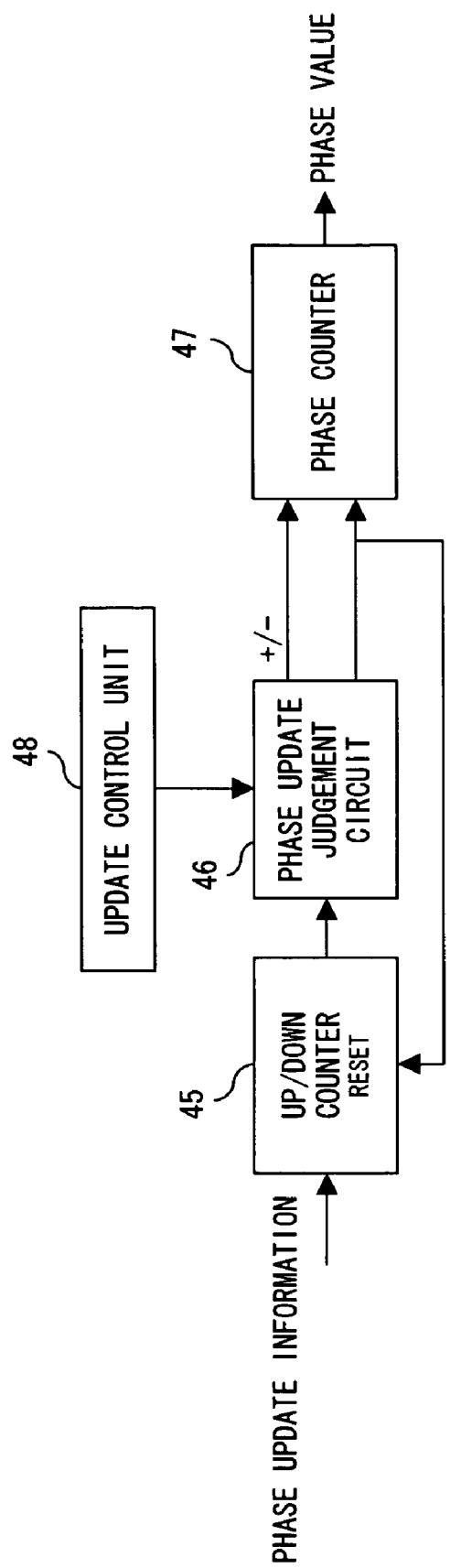
FIG. 3 shows the block diagram of the phase control circuit.

FIG. 3 shows the block diagram of the phase control circuit. In the update control unit 48 shown in FIG. 3, either of the reference signal, the feedback signal, the address of the distortion compensation table, or the phase value is inputted to the phase update judgement circuit 46. That is to say, the update control unit 48 uses the input of said circuit which the distortion compensation circuit requires to compensate distortion and instructs to make the phase update judgement circuit 46 implement phase updating or to stop implementing phase updating.

The phase update information obtained as the result of computing the correlation value is inputted to an updown counter 45. In the updown counter 45, the count value counts up or down each time phase update information is inputted, and when the count value becomes a given value, the updown counter 45 instructs the phase update judgement circuit 46 to update the phase value. By so doing, the phase value can be updated without reacting sensitively to the change of the phase update information which occurs momentarily.

The phase update judgement circuit 46 instructs the phase counter 47 to update the phase value of a predetermined step based on the instruction from the updown counter 45. At that time, the phase update judgement circuit 46 judges the value of the phase update instruction inputted from the updown counter 45 is plus or minus, and instructs the phase counter 47 to set the phase value to plus or minus. Also, the phase update judgement circuit 46 instructs the phase counter 47 to update the phase value, and inputs a reset signal to the updown counter 45. Therefore, the updown counter 45 continues to implement counting until the phase value becomes a predetermined value each time the phase value is updated.

The phase counter 47 adds or decreases the phase value by a given step in accordance with the instruction from the phase update judgement circuit 46. Then, the phase counter 47 outputs the phase value thus obtained and makes the quadrature demodulator adjust the phase.

Figure 4:
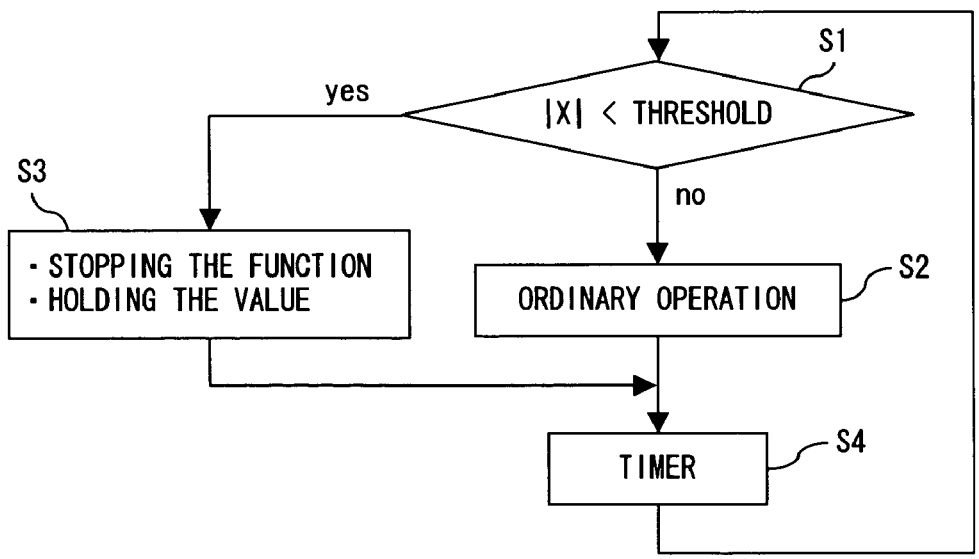
FIG. 4 is a flowchart (1) of the processing that the update control unit 48 performs.
Figure 5:
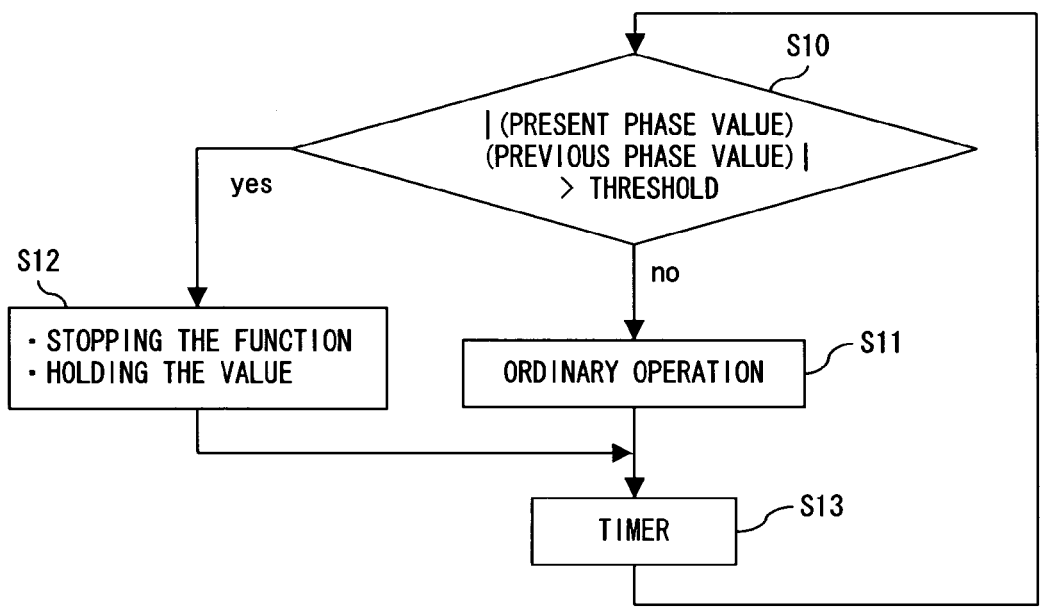
FIG. 5 is a flowchart (2) of the processing that the updating control unit 48 performs.

FIG. 4 to FIG. 6 are flowcharts showing the processing which the update control unit 48 implements.

In the case of a reference signal, a feedback signal, an address of the distortion compensation table (a power value of an input baseband signal), if the size of the signals is equal to or less than a certain threshold, and in the case of a phase value, if the difference from the previous phase value is equal to or more than a certain threshold, the phase value is prevented from becoming an abnormal value by stopping the phase updating.

FIG. 4 is a flowchart showing the processes of detecting the abnormality of a reference signal, a feedback signal, or an address of the distortion compensation table.

In FIG. 4, x is the signal value of the reference signal, the signal value of the feedback signal, or the address value of the distortion compensation table. In Step S1, it is judged whether the absolute value of x is smaller than the threshold. This is to judge whether x is 0 (zero) or only a noise component, and the threshold is what should be determined appropriately by the person of ordinary skill in the art.

If the judgement is No in Step S1, the update control unit 48 conducts an ordinary operation in Step S2, and proceeds to Step S4. If the judgement in Step S1 is Yes, since some abnormality has been detected, the update control unit 48 stops the phase control function in Step S3 and holds the signal value or address value before the abnormality has been detected, and proceeds to Step S4. In Step S4, the time interval in which the abnormality of the signal value or address value is detected is calculated by a timer (not shown in FIG. 4) which the update control unit 48 has. When this timer times out, the update control unit 48 proceeds to Step S1 again and repeats the processing. Several seconds to several tens of seconds are considered as the time in which the timer times out.

FIG. 5 is a flowchart showing the processes of detecting the abnormality of a phase value.

In Step S10, it is judged whether the absolute value of the difference between the phase value stored in the previous processing and the phase value acquired in the current processing is larger than the threshold. This threshold is what should be set appropriately by the person of ordinary skill in the art.

If the judgement in Step S10 is No, the update control unit 48 conducts an ordinary operation in Step S11, and proceeds to Step S13. If the judgement in Step S10 is Yes, since some abnormality has been detected, the update control unit 48 stops the phase control function and holds the previous phase and proceeds to Step S13. In Step S13, when the timer measures time and times out, the update control unit 48 goes back to Step S10 and repeats the processing. The time in which the timer times out is the same as described above.

FIG. 6 is a flowchart showing the processes of monitoring the feedback signal which is x and which has become extremely large due to a fault, etc. of an amplifier.

In Step S15, it is judged whether the absolute value of x is larger than the threshold. This threshold is also what is appropriately determined as an upper-limit predictable value by the person of ordinary skill in the art as a feedback signal value. If the judgement in Step S15 is No, the update control unit 48 conducts an ordinary operation in Step S16, and proceeds to Step S18. If the judgement in Step S15 is Yes, the update control unit 48 stops the phase control function and holds the previous phase and proceeds to Step S18. In Step S18, the timer measures the time interval for monitoring the feedback signal in the same way as the previous processing.

The signal value, address value and phase value which frequently change are monitored in every given time using this timer, and when some abnormality is detected, implementing an inappropriate distortion compensation can be prevented by stopping the automatic phase control function.

In the flows of FIG. 4 to FIG. 6, the update control unit 48 implements phase updating based on the signals received, and processes the signals successively in the order of the signal inputted. If any abnormality is detected in any of the signals inputted, the update control unit 48 is made to stop the phase control function.

Here, an automatic phase adjustment device using a correlation value has been explained, but this embodiment can be also applied to another method by stopping the phase updating in the same way.

In the automatic phase adjustment, the phase of a reference signal is made to conform to the phase of a feedback signal, but in fact, there is a slight error, and this error is taken out by an error signal and is reflected to the updating of a distortion compensation coefficient. Therefore, even if the phase of the reference signal conforms to the phase of the feedback signal, the phases of the input baseband signal and the radio frequency signal do not conform. However, since the phase of a radio frequency signal which is transmitted by a radio frequency rotates randomly during the transmission in the air, the phase of a radio frequency signal should be adjusted on the receiver side and then should be received. Therefore, the phase of the input baseband signal and the phase of the radio frequency signal to be transmitted do not necessarily need to conform to each other.

Refer to the following patent description for the automatic phase adjustment.

Patent application No. 2002-95145

2. Automatic Delay Adjustment

In an adaptive predistortor type distortion compensator, an error signal is used to update a distortion compensation coefficient. The time correlation between a reference signal and a feedback signal needs to conform to obtain a correct error signal. Then, before implementing the distortion compensation operation, the correlation between the reference signal and the feedback signal is calculated while changing the delay of the reference signal, and the timing in which the output power value becomes maximum is detected to adjust the delay. This method is called automatic delay adjustment.

FIG. 7 shows the block diagram of an adaptive predistortor type distortion compensator in which automatic delay adjustment is considered. In FIG. 7, the same reference number or mark is given to the same constituent as in FIG. 1 to omit a detailed explanation of the constituent.

Described below is the flow of the automatic delay adjustment.

(1) The tap coefficient of the FIR filter (low-pass filter 17) on the feedback side is conformed to the symbol point of the quadrature-demodulated signal.

(2) Digital delay (the variable delay device 51 to 53) is set to 0.

(3) The correlation between the reference signal and the feedback signal is calculated (the correlation computing unit 50).

(4) The maximum correlation value which the delay control unit 54 holds and the most up-to-date correlation value which the correlation computing unit 50 has computed are compared, and a larger value and its timing are held.

(5) Digital delay is incremented by +1 (the delay control unit 54 increments the amount of the digital delay of the variable delay device 51 to 53 by +1).

(6) The procedures (3) to (5) are repeated until the digital delay becomes a maximum value.

(7) The delay amount of the timing in which the correlation value becomes maximum is set to the variable delay device 51 to 53.

(8) The operations (3) and (4) are implemented while changing the tap coefficient of the FIR filter (low-pass filter 17).

(9) The tap coefficient of the timing in which the correlation value becomes maximum is set to the FIR filter (low-pass filter 17).

Figure 8:
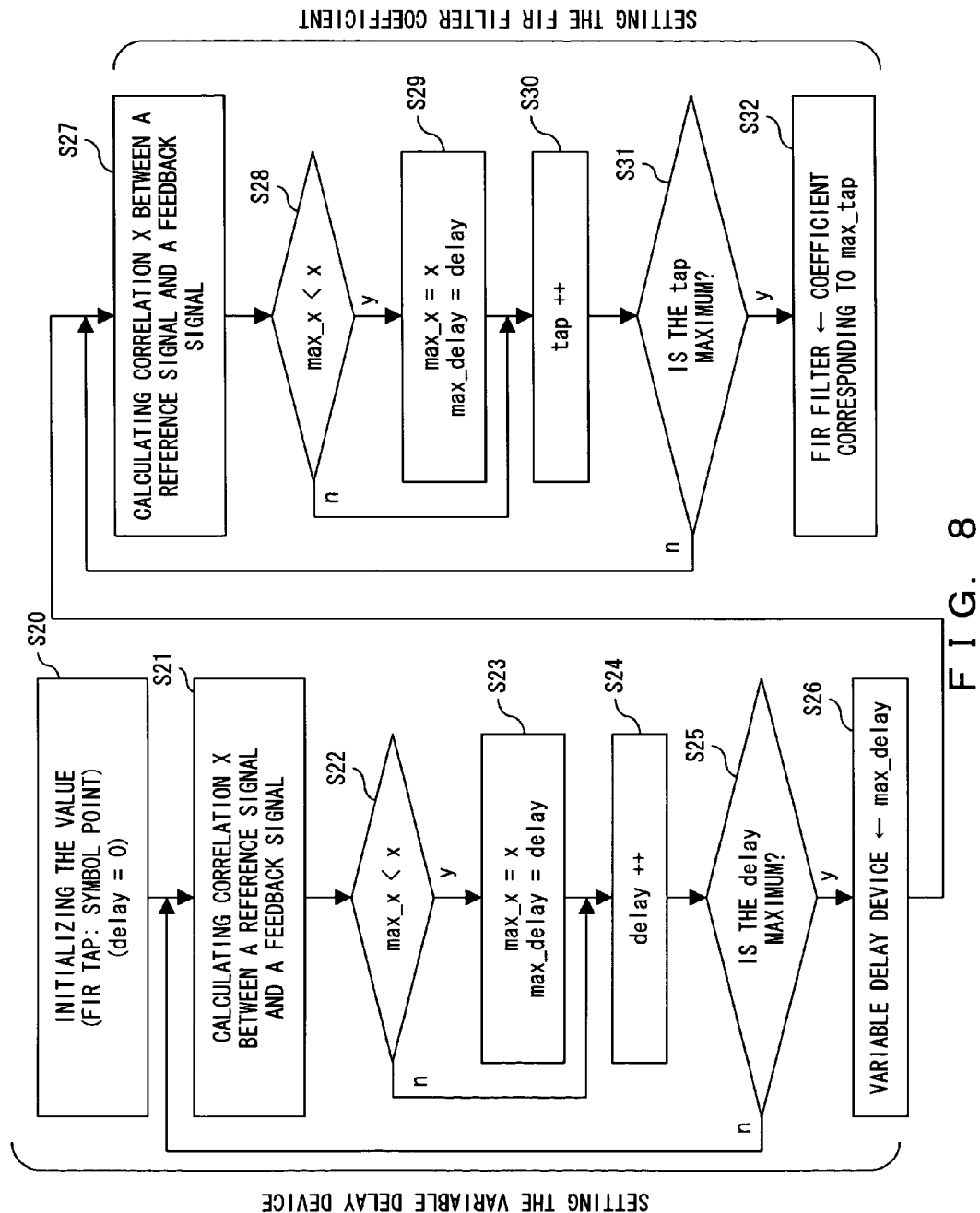
FIG. 8 is a detailed drawing showing the processing flow of delay control.

FIG. 8 shows further details of the processing flow of the delay control.

In Step S20, the tap of the FIR is conformed to the symbol point. In other words, the delay which is given to the feedback signal by the FIR filter is made 0. Then, in Step S21, the correlation x between the reference signal and the feedback signal is calculated, and in Step S22, whether x is larger than max_x which is stored in a memory as the maximum correlation value is judged. If the judgement in Step S22 is No, the processing proceeds to Step S24. If the judgement in Step S22 is Yes, x is substituted for max_x, and the delay value "delay" when the correlation value is x is substituted for max_delay, and then the processing proceeds to Step S24. In Step S24, the delay value "delay" is incremented by +1, and in step S25, whether the delay value "delay" is maximum is judged. If the judgement in Step S25 is No, the processing goes back to Step S21 and the processing is repeated. If the judgement in Step S25 is Yes, the processing proceeds to Step S26. In Step S26, the delay value of max_delay is set to the variable delay device. Now, the setting of the variable delay device is completed.

Next, the FIR filter coefficient is set.

In Step S27, the correlation x between the reference signal and the feedback signal is calculated. In Step S28, whether the maximum value max_x of up to the previous correlation is larger than x is judged. If the judgement in Step S28 is No, the processing proceeds to Step S30, and if the judgement in Step S28 is Yes, the processing proceeds to Step S29. In Step S29, x is substituted for max_x, and the tap value "tap" is substituted for max_tap, and the processing proceeds to Step S30.

In step S30, tap is incremented by +1, and in Step S31, whether the tap is maximum is judged. If the judgement in Step S31 is No, the processing proceeds to Step S27, and if the judgement in Step S31 is Yes, a coefficient corresponding to max_tap is set to the FIR filter in Step S32. Now, the setting of the delay value is completed.

Here, the update control unit 48 shown in FIG. 7 inputs any out of the reference signal, feedback signal, address of the distortion compensation table, and phase value of the automatic phase adjustment to the delay control unit 54. In the case of the reference signal, feedback signal and address, when their size is equal to or less than a certain threshold, and in the case of the phase value, when the difference from the previous phase value is equal to or more than a certain threshold, and in the case of the feedback signal, when its size is equal to or more than a certain threshold, the update control unit 48 makes the variable delay device 51 to 53 and the FIR filter (low-pass filter 17) stop the setting operation for adjusting the timing, and uses a value immediately before the setting operation is stopped. Thus, the delay value is prevented from becoming an abnormal value. The flowchart showing this processing is as shown in FIG. 4 to FIG. 6. However, what differs from FIG. 4 to FIG. 6 is only that the function for stopping said operation and the function for performing an ordinary operation shown in FIG. 4 to FIG. 6 are not automatic phase adjustment but automatic delay adjustment.

Refer to the following patent application for details of the automatic delay adjustment.

Kokai (Jpn. unexamined patent publication) No. 2001-189685

Kokai (Jpn. unexamined patent publication) No. 2001-999995

3. Equalizer

A signal has frequency characteristics according to the characteristics of the analog part of an adaptive predistortor type distortion compensator, particularly the characteristics of the band-pass filter which is inserted into an IF frequency. By compensating the frequency characteristics using an equalizer, the compensation characteristics of a linearizer can be improved.

Figure 9:
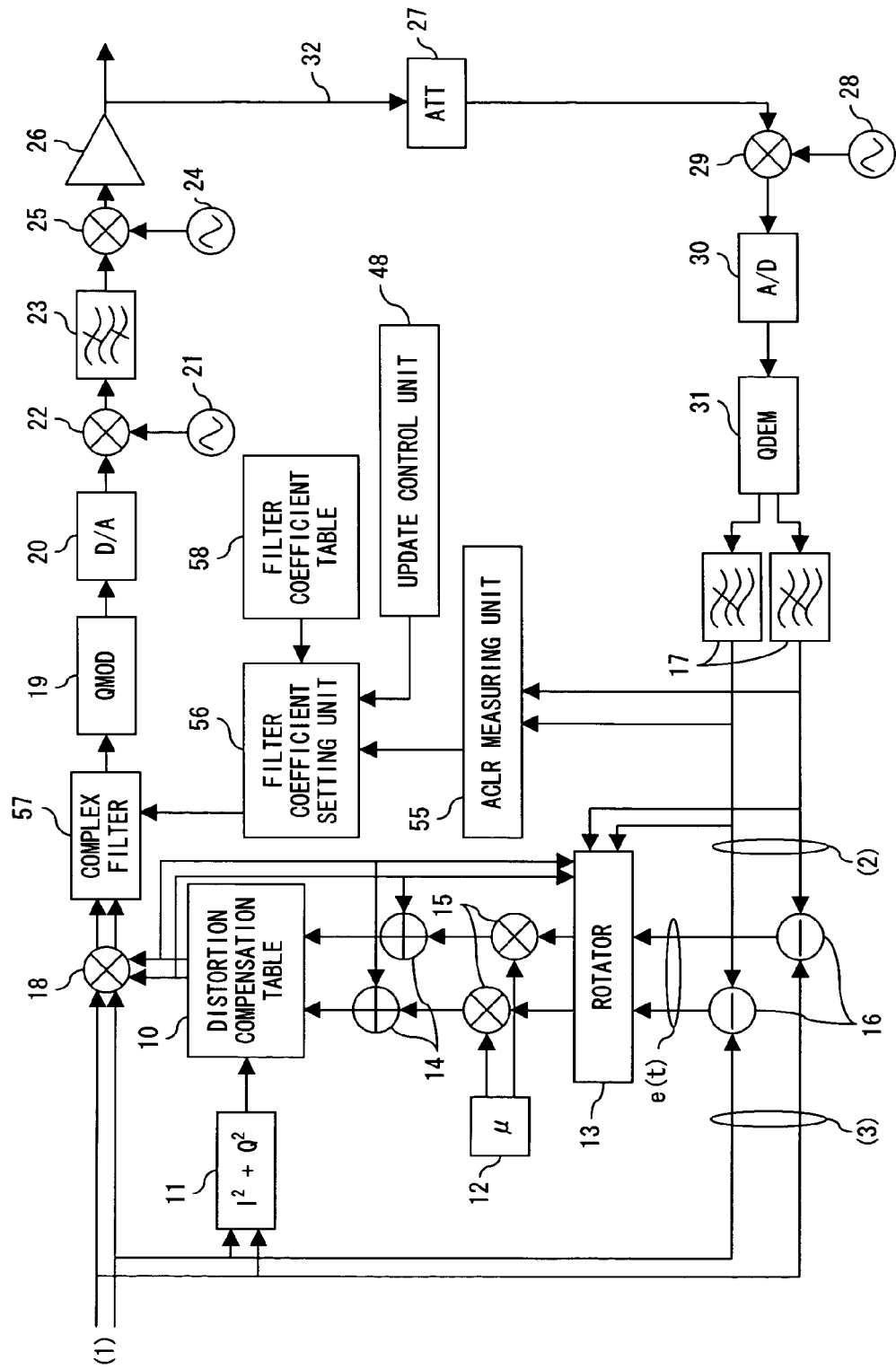
FIG. 9 shows an example of the configuration of the adaptive predistortor type distortion compensator when the embodiment of the present invention is applied to the configuration using an equalizer.

FIG. 9 shows an example of the configuration of the adaptive predistortor type distortion compensator when the embodiment of the present invention is applied to the configuration using an equalizer. In FIG. 9, the same number or mark is given to the same constituents as in FIG. 1 to omit a detailed explanation of the constituent.

A complex filter 57 shown in FIG. 9 plays the role of the equalizer. The method of setting the complex filter 57 is described as follows.

(1) Filter coefficients are stored in the filter coefficient table 58 in the order from a negative inclination of frequency characteristics to a positive inclination of frequency characteristics.

(2) One of the coefficients stored in the filter coefficient table 58 is stored in the complex filter 57 via a filter coefficient setting unit 56.

(3) An ACLR (Adjacent Channel Leakage Ratio) is measured using FFT (an ACLR measurement unit 55).

(4) The filter coefficients before or after the set filter coefficient are also stored, and the ACLR of said filter coefficients is also measured.

(5) The filter coefficient whose ACLR is the best is set to the complex filter.

(6) The operations (2) to (5) above are repeated so as to follow the fluctuations of temperature.

Here, the update control unit 48 shown in FIG. 9 inputs any of the reference signal, feedback signal, address of the distortion compensation table, or phase value of the automatic phase adjustment to the filter coefficient setting unit 56. In the case of the reference signal, feedback signal and address, when their size is equal to or less than a certain threshold, or in the case of the phase value, when the difference from the previous phase value is equal to or more than a certain threshold, the update control unit 48 stops the operation of setting a new filter coefficient to the complex filter, and uses the previous value. Thus, the equalizer is prevented from performing an abnormal operation and deteriorating the distortion compensation characteristics. The flowchart showing this processing is as shown in FIG. 4 to FIG. 6. However, the function for stopping said operation and the function for performing an ordinary operation shown in FIG. 4 to FIG. 6 are to update and set the filter coefficient of the complex filter which is the equalizer.

Refer to the following patent application for the technology of the equalizer.

Patent application No. 2002-95920

4. Protection of Values in the Distortion Compensation Coefficient Table

Figure 10:
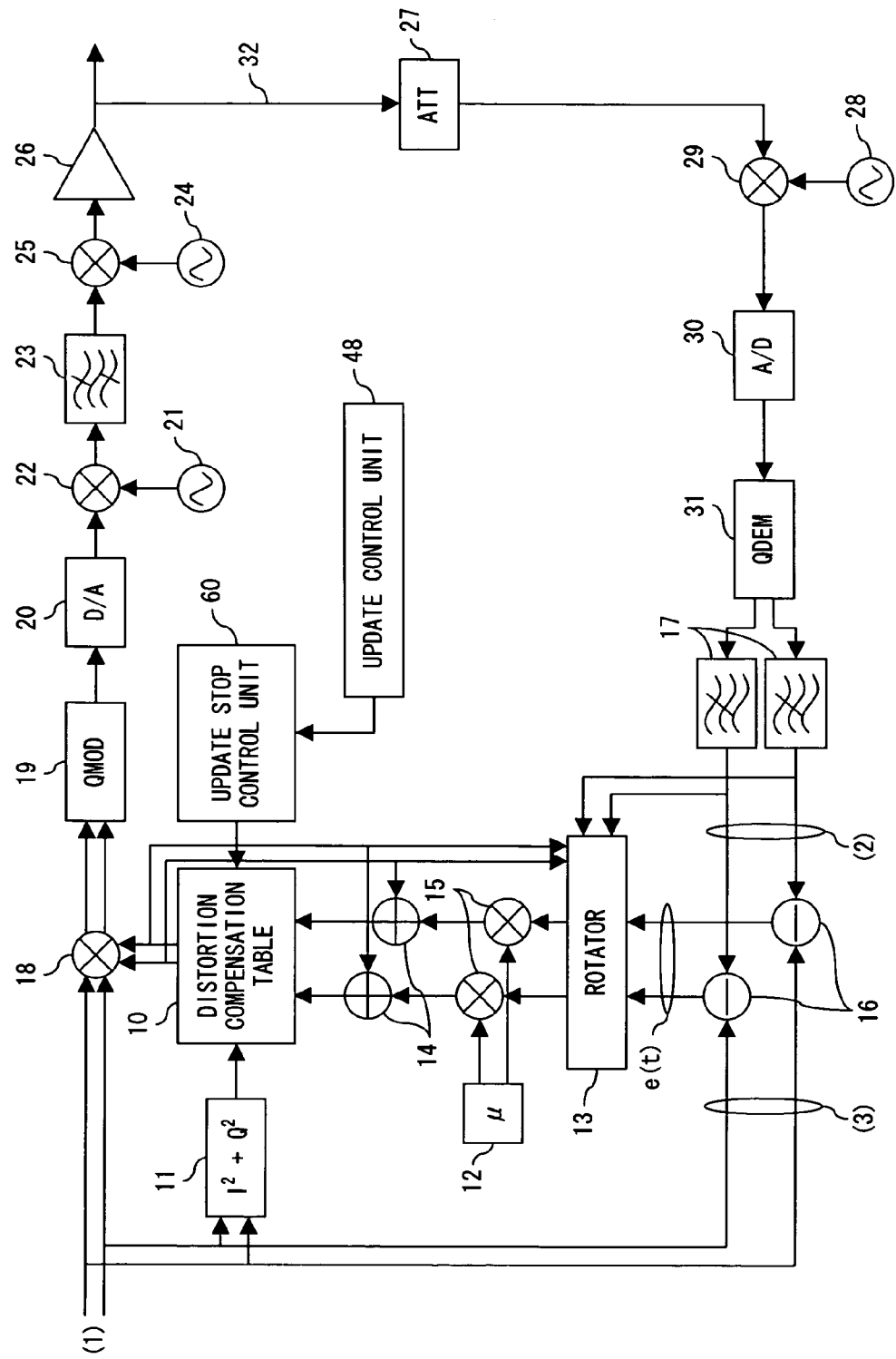
FIG. 10 shows the adaptive predistortor type distortion compensator to which a function for protecting a distortion compensation table value is added.

FIG. 10 shows the adaptive predistortor type distortion compensator to which a function for protecting the values in the distortion compensation table is added. In FIG. 10, the same number or mark is given to the same constituent as in FIG. 1 to omit a detailed explanation of the constituent.

The update control unit 48 shown in FIG. 10 inputs any out of the reference signal, feedback signal, address of the distortion compensation table, or phase value of the automatic phase adjustment to an update stop control unit 60. In the case of the reference signal, feedback signal and address, when the their size is equal to or less than a certain threshold, and in the case of the phase value, when the difference from the previous phase value is equal to or more than a certain threshold, the update control unit 48 stops the update of the distortion compensation table, and uses previous values. Thus, distortion compensation characteristics are prevented from deteriorating. In this case, however, the function for stopping said operation and the function for performing an ordinary operation are to control the output of a write enable signal of the distortion compensation table 10 which is a memory such as prohibition of writing and permission of writing of the distortion compensation table 10.

5. An Example of the Configuration Including the Four Above-Mentioned Functions

Figure 11:
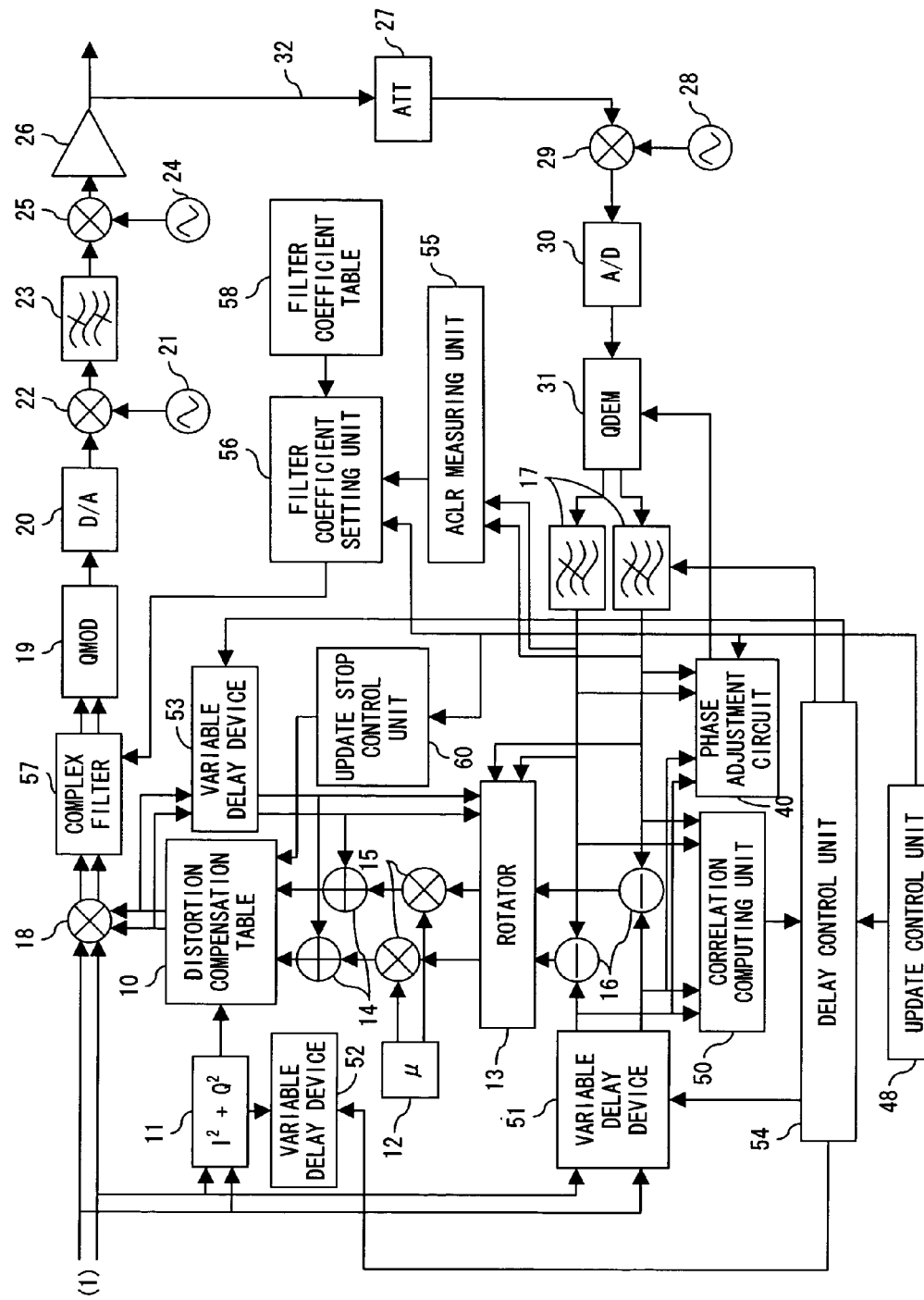
FIG. 11 shows an example of the configuration of the distortion compensator including all the four configurations of automatic phase control, automatic delay control, equalizer control and distortion compensation table control.

FIG. 11 shows an example of the configuration of the distortion compensator including all the four functions of automatic phase control, automatic delay control, equalizer control and distortion compensation table control. The same number or mark is given to the same constituent as in FIG. 2, FIG. 7, FIG. 9 and FIG. 10 to omit a detailed explanation of the constituent.

In FIG. 11, the operation of each function is as described above. However, the stop of the four functions i.e. automatic phase control, automatic delay control, equalizer control, and distortion compensation table control means to prevent the distortion compensation coefficient from being improperly updated. Therefore, when something wrong is detected in the input of the distortion compensation unit while monitoring the input of the distortion compensation unit which comprises the distortion compensation table 10, adder 14, multiplier 15, update step value storage unit 12, rotator 13, and subtractor 16, the update control unit 48 implements the operation of stopping each function.

According to the present invention, the adaptive predistortor type distortion compensator can reduce a negative influence that results in the distortion compensation characteristics being deteriorated rapidly, by immediately detecting something wrong when there is such abnormality with a signal due to a fault, etc. of the compensator, and stopping each function properly.

What is claimed is:

1. A distortion compensator which compensates the non-linearity of an amplifier included in a communication device, comprising:
    a distortion compensation coefficient storage unit for storing a distortion compensation coefficient which compensates distortion by multiplying an input baseband signal;
    a distortion compensation coefficient update unit for updating the distortion compensation coefficient; and
    a distortion compensation stop unit for stopping a distortion compensation operation when there occurs a phase difference between a reference signal and a feedback signal as inputs of a distortion compensation unit comprising at least the distortion compensation coefficient storage unit and the distortion compensation coefficient update unit.

2. The distortion compensator according to claim 1, wherein
    the input of the distortion compensation unit is any out of the reference signal obtained by separating the input baseband signal, the feedback signal obtained by feeding back the output of the amplifier, the address for reading the distortion compensation coefficient from the distortion compensation coefficient storage unit, and the phase value of the phase control implemented to the phase of the reference signal to the phase of the feedback signal.

3. The distortion compensator according to claim 2, wherein
    when the value of the reference signal, feedback signal, and address is equal to or less than a given value, the compensator stops the operation of distortion compensation.

4. The distortion compensator according to claim 2, wherein
    when the value of the reference signal, feedback signal, and address is equal to or more than a given value, the compensator stops the operation of distortion compensation.

5. The distortion compensator according to claim 2, wherein
    when the phase value greatly differs from the previous value, the compensator stops the operation of distortion compensation.

6. The distortion compensator according to claim 1, wherein
    the distortion compensation coefficient update unit has a phase difference compensation unit for compensating the difference of phases between the reference signal obtained by separating the input baseband signal and the feedback signal obtained by feeding back the output of the amplifier; and
    the distortion compensation stop unit stops the automatic update function of the phase difference of the phase difference compensation unit.

7. The distortion compensator according to claim 6, wherein
    the phase difference compensation unit controls the phase of a periodic wave multiplied by the signal from the amplifier to obtain the feedback signal, in the demodulator provided in a feedback path.

8. The distortion compensator according to claim 1, wherein
    the distortion compensation coefficient update unit comprises a unit for acquiring an error signal from the reference signal obtained by separating the input baseband signal and the feedback signal obtained by feeding back the output of the amplifier and a delay amount adjustment unit for adjusting the delay amount of the reference signal and the feedback signal; and
    the distortion compensation stop unit stops the automatic delay amount adjustment function of the delay amount adjustment unit.

9. The distortion compensator according to claim 8, wherein
    the delay amount adjustment unit has a delay unit which adjusts the delay in units of clock and a digital filter which adjusts the delay which is equal to or less than a clock cycle.

10. The distortion compensator according to claim 1, wherein
    the distortion compensation coefficient update unit has an equalizer unit for equalizing the distortion of the signal given by the analog unit which implements the processing using an analog signal; and
    the distortion compensation stop unit stops the automatic equalization function of the equalizer unit.

11. The distortion compensator according to claim 10, wherein
the equalizer unit is a complex filter.

12. The distortion compensator according to claim 10, wherein
the equalizer unit implements equalization processing by measuring the adjacent channel leakage power ratio of a feedback signal.

13. The distortion compensator according to claim 1 which has a writing control unit for controlling the writing of the distortion compensation coefficient storage unit, wherein
the distortion compensation stop unit makes the writing to the distortion compensation coefficient storage unit impossible by the writing control unit.

14. A distortion compensation method which compensates the nonlinearity of an amplifier included in a communication device, comprising:
storing a distortion compensation coefficient which compensates distortion by multiplying an input baseband signal;
updating the distortion compensation coefficient; and
stopping a distortion compensation operation when there occurs a phase difference between a reference signal and a feedback signal as inputs of a distortion compensation unit performing at least the distortion compensation coefficient storage step and the distortion compensation coefficient update step.

15. The distortion compensation method according to claim 14, wherein
the input of the distortion compensation step is any out of the reference signal obtained by separating the input baseband signal, the feedback signal obtained by feeding back the output of the amplifier, the address for reading the distortion compensation coefficient from the distortion compensation coefficient storage step, and the phase value of the phase control implemented to the phase of the reference signal to the phase of the feedback signal.

16. The distortion compensation method according to claim 15, wherein
when the value of the reference signal, feedback signal, and address is equal to or less than a given value, the compensator stops the operation of distortion compensation.

* * * * *